United States Patent
Tsubata et al.

(10) Patent No.: US 12,072,364 B2
(45) Date of Patent: Aug. 27, 2024

(54) AVIATION SYSTEM

(71) Applicants: SUBARU CORPORATION, Tokyo (JP); JAPAN AEROSPACE EXPLORATION AGENCY, Tokyo (JP)

(72) Inventors: Hiroyuki Tsubata, Tokyo (JP); Hiromitsu Miyaki, Tokyo (JP); Takao Okada, Tokyo (JP)

(73) Assignees: SUBARU CORPORATION, Tokyo (JP); JAPAN AEROSPACE EXPLORATION AGENCY, Tokyo (JP)

( * ) Notice: Subject to any disclaimer, the term of this patent is extended or adjusted under 35 U.S.C. 154(b) by 114 days.

(21) Appl. No.: 17/669,833

(22) Filed: Feb. 11, 2022

(65) Prior Publication Data

US 2022/0299552 A1  Sep. 22, 2022

(30) Foreign Application Priority Data

Mar. 18, 2021 (JP) ................................ 2021-045045

(51) Int. Cl.
*G01R 29/08* (2006.01)

(52) U.S. Cl.
CPC ..... *G01R 29/0878* (2013.01); *G01R 29/0807* (2013.01); *G01R 29/0842* (2013.01); *G01R 29/0892* (2013.01)

(58) Field of Classification Search
None
See application file for complete search history.

(56) References Cited

U.S. PATENT DOCUMENTS

| 5,140,523 A | 8/1992 | Frankel et al. |
| 8,601,864 B1 * | 12/2013 | Eilts ........................ G01S 7/025 73/170.16 |

(Continued)

FOREIGN PATENT DOCUMENTS

| CN | 106405253 A | 2/2017 |
| CN | 110174557 A | 8/2019 |

(Continued)

OTHER PUBLICATIONS

Google Machine Translation of Chinese Patent Pub. No. CN109738970B that was filed in 2018 (hereinafter "the '970") (Year: 2018).*

(Continued)

*Primary Examiner* — Jean Paul Cass
(74) *Attorney, Agent, or Firm* — MCGINN I.P. LAW GROUP, PLLC.

(57) ABSTRACT

According to one implementation, an aviation system 100 includes electric field sensors 112 and a ground system 114 including a computer configured to communicate with each of the electric field sensors 112. The computer is configured to: acquire electric field intensities from the electric field sensors 112 respectively, and generate a first electric field distribution on a ground surface 16 based on the electric field intensities; derive a matrix; derive a pseudo inverse matrix of the matrix; derive an electric charge distribution on the horizontal plane by multiplying the pseudo inverse matrix by the first electric field distribution on the ground surface 16; and derive a second electric field distribution on a flight path based on the electric charge distribution. The first electric field distribution on the ground surface 16 is derived by multiplying the matrix by electric charges temporarily set on a horizontal plane at a predetermined altitude.

8 Claims, 10 Drawing Sheets

(56) References Cited

U.S. PATENT DOCUMENTS

| | | | | |
|---|---|---|---|---|
| 8,984,939 B1* | 3/2015 | Eilts | ............ | G01S 7/412 |
| | | | | 73/170.17 |
| 9,519,057 B1* | 12/2016 | Eilts | ............ | G01S 13/89 |
| 10,126,424 B1* | 11/2018 | Eilts | ............ | G01S 13/89 |
| 2011/0248863 A1* | 10/2011 | Johnson | ............ | H04L 67/53 |
| | | | | 340/686.1 |
| 2014/0327547 A1* | 11/2014 | Johnson | ............ | H04L 67/53 |
| | | | | 340/601 |
| 2015/0256277 A1* | 9/2015 | Johnson | ............ | G08B 27/006 |
| | | | | 340/601 |
| 2018/0196163 A1 | 7/2018 | Desmond | | |

FOREIGN PATENT DOCUMENTS

| | | |
|---|---|---|
| JP | H04-071197 A | 3/1992 |
| JP | 3446635 B2 * | 9/2003 |
| JP | 2020-147137 A | 9/2020 |
| WO | WO 92/10804 A1 | 6/1992 |

OTHER PUBLICATIONS

Google Machine Translation of Japanese Patent Pub. No. JP5695925B2 (hereinafter "the '925 JP publication"). (Year: 2011).*

Google Machine Translation of Chinese Patent Pub. No. CN107608386A that was filed in 2017 (hereinafter "the shanghair reference") (Year: 2017).*

Google Machine Translation of JP-3446635-B2 1998.*

Beck Y: "3D lightning strikes probability 1-4 program", Electrical and Electronics Engineers in Israel, 2008. IEEEI 2008. IEEE 25th Convention of, IEEE, Piscataway, NJ, USA, Dec. 3, 2008 (Dec. 3, 2008), pp. 368-372, XP031399424, ISBN: 978-1-4244-2481-8, p. 358-371.

Extended European Search Report issued Aug. 23, 2022 for European Patent Application No. 22155935.4-1001.

* cited by examiner $$\text{ACQUIRED ELECTRIC FIELD INTENSITY} = \underbrace{\sum \frac{1}{4\pi\varepsilon \, \text{POINT-TO-POINT DISTANCE}^2} \times 2\frac{\text{CLOUD BOTTOM ALTITUDE}}{\text{POINT-TO-POINT DISTANCE}}}_{\text{COEFFICIENT MATRIX}} \times \text{ELECTRIC CHARGE}$$

FIG. 7

(A)
```
epsilon = 8.8541878128E-12;
sidex = 10000; sidey = 10000; height = 10000;
meshx = 51; meshy = 51;
dx = sidex/meshx; dy = sidey/meshy;
C0 = zeros(meshy,meshx);
p1 = floor(meshy/4); p2 = floor(meshy/4*3);
```

(B)
```
C0(p1,p2)=9; C0(p2,p1)=-5;
```

(C)
```
k = zeros(meshx*meshy,meshx*meshy);
for m=1:meshx % x axis
    for n=1:meshy %y axis
        for j=1:meshx % x axis
            for i=1:meshy %y axis
                length2 = (i-n)^2*dx*dx+(j-m)^2*dy*dy+height^2;
                k(i+meshy*(j-1),n+meshy*(m-1))
                    = 1/4/pi/epsilon/length2 * 2*height/sqrt(length2);
            end
        end
    end
End
```

(D)
```
E0 = reshape(k*reshape(C0,meshx*meshy,[]),meshy,meshx);
E1 = E0;
```

(E)
```
% Solve charges by a pseudo inverse matrix
C1
= reshape(pinv(k)*reshape(E1,meshx*meshy,[]),meshy,meshx);
```

(F)
```
h = ones(10,10);
C2 = filter2(h,C1,'same');
```

(G)
```
E2 = reshape(k*reshape(C2,meshx*meshy,[]),meshy,meshx);
```

(H)
```
% Compensate removed charges
if abs(max(max(E1))) > abs(min(min(E1)))
    C2 = C2 * max(max(E1)) / max(max(E2));
else
    C2 = C2 * min(min(E1)) / min(min(E2));
end
```

FIG. 8

AVIATION SYSTEM

CROSS REFERENCES TO RELATED APPLICATIONS

This application is based upon and claims the benefit of priority from Japanese Patent Application No. 2021-045045, filed on Mar. 18, 2021; the entire contents of which are incorporated herein by reference.

FIELD

Implementations described herein relate generally to an aviation system and an aviation method.

BACKGROUND

Conventionally, the technology of avoiding a lightning strike by ion emission has been examined. For example, a lightning strike preventive system by which ion attached to fog by causing corona discharge is emitted from the ground to form an ion cloud, and thereby it is attempted to avoid a lightning strike direct to the ground is described in Japanese Patent Application Publication JP 1992 (H04)-071197.

A lightning strike may arise not only to a facility on the ground but to an aircraft. An aircraft is a conductor, and therefore a lightning strike whose trigger is an aircraft often arises since an electric field in a space under a thundercloud concentrates on the aircraft. Accordingly, it is desired to develop the technology of reducing a lightning strike on an aircraft.

For example, it may be considered that a position at which a thundercloud appears is predicted so that a flight path which can avoid the thundercloud can be derived. However, it is difficult to correctly predict a position at which a lightning strike whose trigger is an aircraft arises, and a position of a thundercloud may differ from an actual position of the lightning strike. It is known that a position of a lightning strike has great influence of an electric field on a flight path of an aircraft. However, there is no effective means to appropriately estimate an electric field in a wide range, such as a flight path.

Accordingly, an object of the present invention is to provide an aviation system and an aviation method which can reduce influence of a lightning strike on an aircraft.

SUMMARY OF THE INVENTION

In general, according to one implementation, an aviation system includes electric field sensors and a ground system including a computer configured to communicate with each of the electric field sensors. The computer is configured to: acquire electric field intensities from the electric field sensors respectively, and generate a first electric field distribution on a ground surface based on the electric field intensities; derive a matrix; derive a pseudo inverse matrix of the matrix; derive an electric charge distribution on the horizontal plane by multiplying the pseudo inverse matrix by the first electric field distribution on the ground surface; and derive a second electric field distribution on a flight path based on the electric charge distribution. The first electric field distribution on the ground surface is derived by multiplying the matrix by electric charges temporarily set on a horizontal plane at a predetermined altitude.

The computer may be further configured to: smooth the derived electric charge distribution; derive a third electric field distribution on the ground surface based on the smoothed electric charge distribution; derive a proportional constant which is a ratio between the first electric field distribution on the ground surface and the third electric field distribution on the ground surface; multiply the smoothed electric charge distribution by the proportional constant; and derive the second electric field distribution on the flight path based on the electric charge distribution which has been multiplied by the proportional constant.

Further, according to one implementation, an aviation method includes: acquiring electric field intensities from electric field sensors respectively by a computer included in a ground system communicating with each of the electric field sensors, and generate a first electric field distribution on a ground surface based on the electric field intensities; deriving a matrix; deriving a pseudo inverse matrix of the matrix; deriving an electric charge distribution on the horizontal plane by multiplying the pseudo inverse matrix by the first electric field distribution on the ground surface; and deriving a second electric field distribution on a flight path based on the electric charge distribution. The first electric field distribution on the ground surface is derived by multiplying the matrix by electric charges temporarily set on a horizontal plane at a predetermined altitude The aviation method may include the following steps. The derived electric charge distribution is smoothed. A third electric field distribution on the ground surface is derived based on the smoothed electric charge distribution. A proportional constant which is a ratio between the first electric field distribution on the ground surface and the third electric field distribution on the ground surface is derived. The smoothed electric charge distribution is multiplied by the proportional constant. The second electric field distribution on the flight path is derived based on the electric charge distribution which has been multiplied by the proportional constant.

BRIEF DESCRIPTION OF THE DRAWINGS

In the accompanying drawings:

FIG. 7 explains the processing in the matrix deriving part;

FIG. 8 explains an example of calculation in the electric field deriving processing;

DETAILED DESCRIPTION

Hereinafter, a preferred implementation of the present invention will be described in detail with reference to the accompanying drawings. The sizes, materials, other concrete numerical values, and the like shown in the implementation are only exemplification for making understanding of the invention easy, and do not limit the present invention as long as no particular comment is made. Note that, the same signs are attached to elements having the same function and/or configuration substantially in the present specification and drawings, and thereby duplicated explanation thereof is omitted. Illustration of elements which are not directly related to the present invention is also omitted.

(Aviation System)

An aircraft is desirable to fly a flight path away from a thundercloud in order to avoid a lightning strike. Therefore, an aviation system predicts a position at which a thundercloud appears, and derives a flight path which can avoid the thundercloud. It is known that a position at which a lightning strike whose trigger is an aircraft arises has great influence of not only a thundercloud on a flight path of the aircraft but an electric field generated due to the thundercloud.

Hereinafter, the influence on an aircraft is considered with equivalently replacing an electric charge distribution in the whole thundercloud with an electric charge distribution in a cloud bottom. Concretely, electric charges equivalent to those distributed perpendicularly and horizontally in a thundercloud is virtually set up as an electric charge distribution in a cloud bottom so that an electric field, in a space below the cloud bottom in the vertical direction, generated by the electric charge distribution in the cloud bottom may become equal to that generated by the electric charge distribution in the whole thundercloud.

Figure 1:
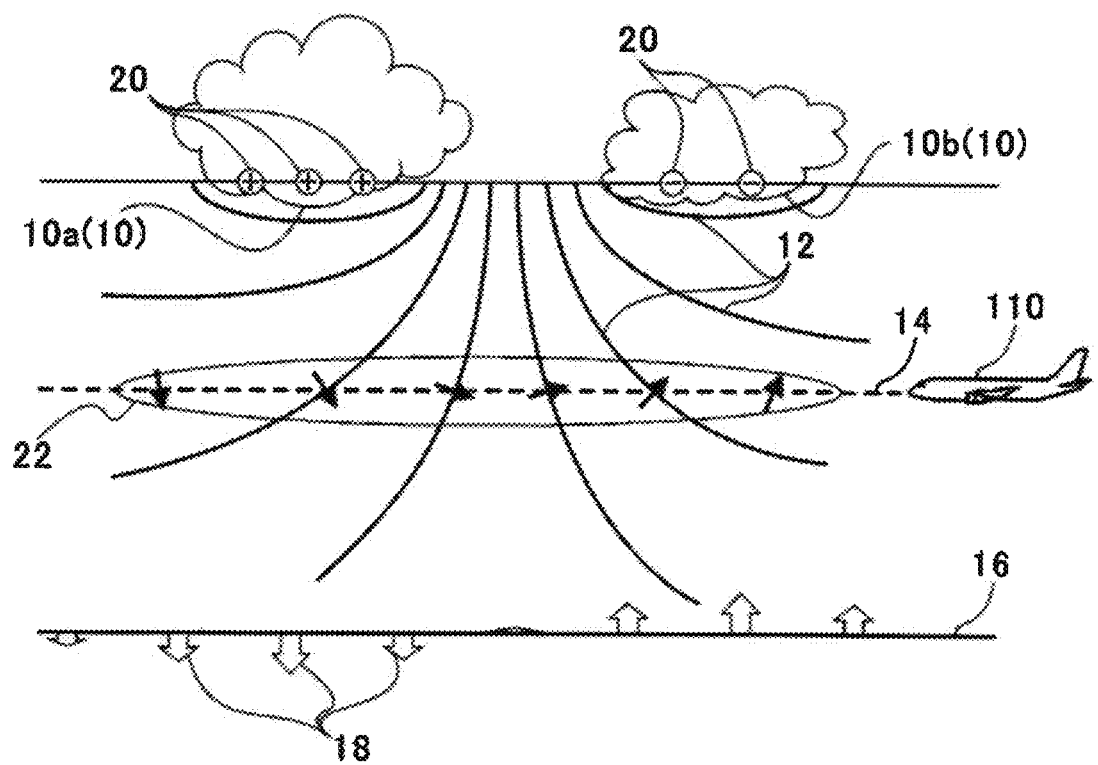
FIG. 1 explains the relationship between a flight path and an electric field.

FIG. 1 explains the relationship between a flight path 14 and an electric field. In the example of FIG. 1, there are two cloud bottoms 10 in the sky. It is assumed that one cloud bottom 10a is charged in the positive polarity side while the other cloud bottom 10b is charged in the negative polarity side. In this case, equipotential surfaces 12 as shown in FIG. 1 are formed due to the cloud bottoms 10a and 10b.

When an aircraft 110 flies along a flight path 14, shown with a broken line, in the above-mentioned electric field, the aircraft 110 is influenced by the electric field generated by the cloud bottoms 10a and 10b. For example, the aircraft 110 is influenced by the electric field as shown with solid arrows in FIG. 1 at respective points on the flight path 14. In such a case, a lightning strike may arise due to the aircraft 110 as a trigger depending on the sizes and directions of the electric field.

Here, it may be considered that the electric charge polarization of the aircraft 110 itself is calculated, and an electric field at a flight position of the aircraft 110 is estimated by the aviation system. However, the estimated electric field is only one near a current flight position, and an electric field cannot be grasped over the whole future flight path 14 of the aircraft 110.

Accordingly, the aviation system acquires an electric field distribution 18 on a ground surface 16, and estimates, based on the electric field distribution 18, an electric charge distribution 20 in case of assuming that electric charges originally distributed over a whole thundercloud are equivalently distributed only in a cloud bottom 10. Then, the aviation system estimates an electric field distribution 22 along the flight path 14 by electrostatic analysis of the estimated electric charge distribution 20. In this way, a high-precision lightning protection system can be constructed.

Figure 2:
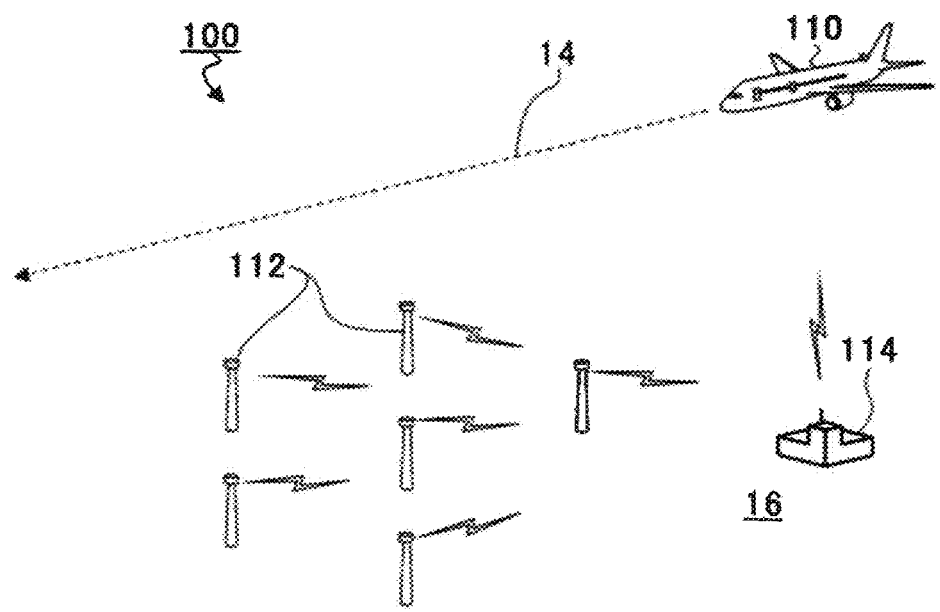
FIG. 2 shows a schematic configuration of the aviation system.

FIG. 2 shows a schematic configuration of the aviation system 100. The aviation system 100 includes an aircraft 110, electric field sensors 112 disposed on the ground and a ground system 114 consisting of circuitry disposed on the ground. Although a passenger aircraft is exemplified as the aircraft 110 here, various machines which fly in the atmosphere can be adopted.

(Electric Field Sensor 112)

Each electric field sensor 112 is installed apart from another electric field sensor 112 by a predetermined distance (for example, a few hundred meters) in a desired region on the ground surface 16, e.g., around an airstrip where influence by lightning is large. Each electric field sensor 112 may be a rotary type electric field measuring instrument (field mill) or the like, and can measure electric field intensity at least at a point at which the electric field sensor 112 is located. Each electric field sensor 112 can also transmit measured electric field intensity to the ground system 114.

(Ground System 114)

Figure 3:
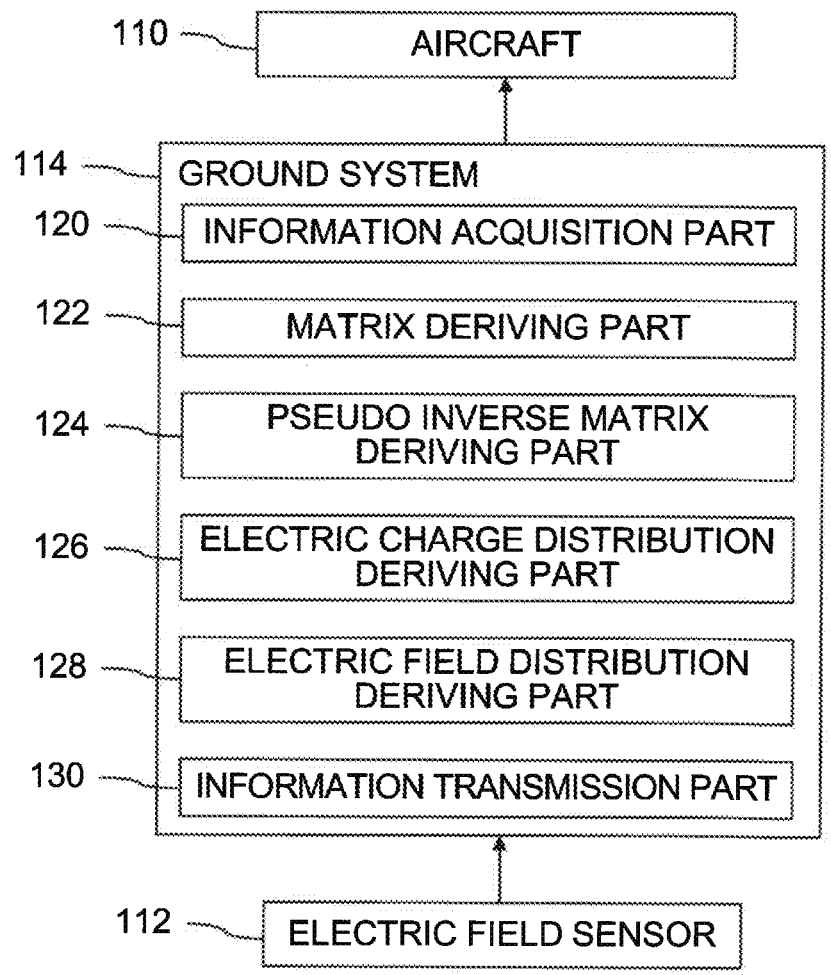
FIG. 3 is a block diagram showing a schematic configuration of the ground system.

FIG. 3 is a block diagram showing a schematic configuration of the ground system 114. The ground system 114 is composed of a computer including a central processing unit (CPU), a read-only memory (ROM) storing programs and the like, a random access memory (RAM) as a work area and the like. The ground system 114 communicates with each of the electric field sensors 112 and the aircraft 110. The ground system 114 functions as an information acquisition part 120, a matrix deriving part 122, a pseudo inverse matrix deriving part 124, an electric charge distribution deriving part 126, an electric field distribution deriving part 128, and an information transmission part 130 by collaborating with programs. Here, configuration related to the lightning strike avoidance which is an object of the present implementation will be described while description about configuration unrelated to the present implementation is omitted.

Figure 4:
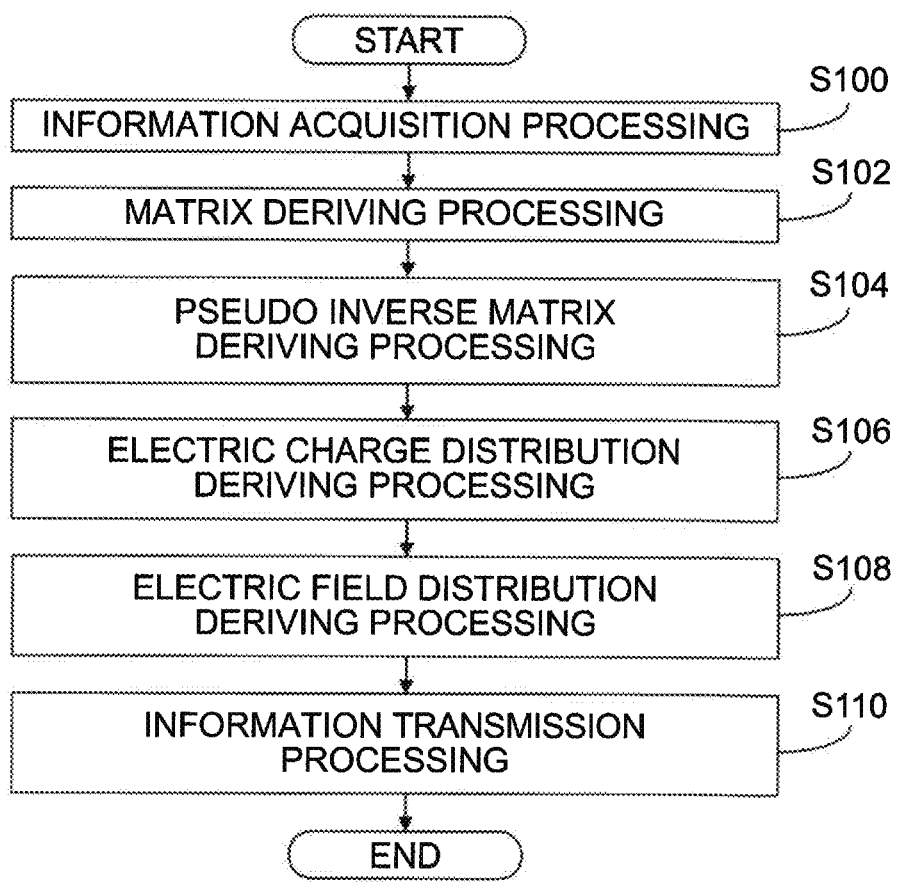
FIG. 4 is a flow chart showing a flow of electric field deriving processing.

FIG. 4 is a flow chart showing a flow of electric field deriving processing. In information acquisition processing S100, the information acquisition part 120 acquires electric field intensities from the electric field sensors 112 respectively to generate the electric field distribution 18 on the ground surface 16. In matrix deriving processing S102, the matrix deriving part 122 derives a coefficient matrix which becomes the electric field distribution 18 on the ground surface 16 by being multiplied by electric charges temporarily set on a cloud bottom surface (horizontal plane) at a predetermined altitude. In pseudo inverse matrix deriving processing S104, the pseudo inverse matrix deriving part 124 derives a pseudo inverse matrix corresponding to the coefficient matrix.

Then, in electric charge distribution deriving processing S106, the electric charge distribution deriving part 126 derives the electric charge distribution 20 on the cloud bottom surface by multiplying the pseudo inverse matrix by the electric field distribution 18 on the ground surface 16. In electric field distribution deriving processing S108, the electric field distribution deriving part 128 derives the electric field distribution 22 on the flight path 14 based on the electric charge distribution 20. In information transmission processing S110, the information transmission part 130 transmits, to the aircraft 110, the electric field distribution on the flight path 14 of the aircraft 110. Hereinafter, the respective processing will be described in detail.

(Information Acquisition Processing S100)

The information acquisition part 120 acquires electric field intensities from the electric field sensors 112 respectively. The information acquisition part 120 relates the acquired electric field intensities to the known positions of the electric field sensors 112 respectively to generate the electric field distribution 18 on the ground surface 16.

Meanwhile, the information acquisition part 120 acquires the flight path 14 along which the predetermined aircraft 110 is planned to fly during predetermined time. The information acquisition part 120 also acquires positions, heights, and sizes of clouds (thunderclouds) from an observatory.

(Matrix Deriving Processing S102)

Figure 5:
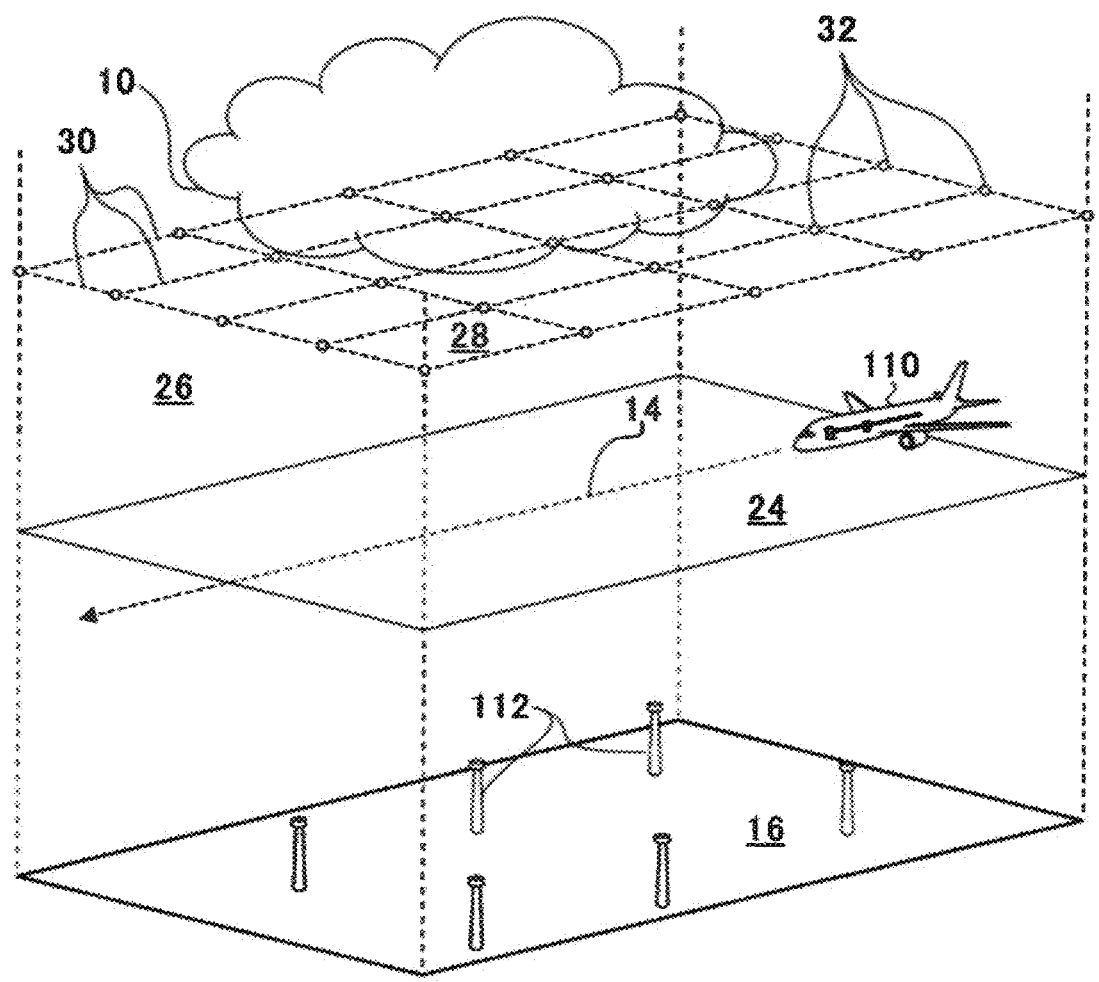
FIG. 5 explains the processing in the matrix deriving part.
Figure 6:
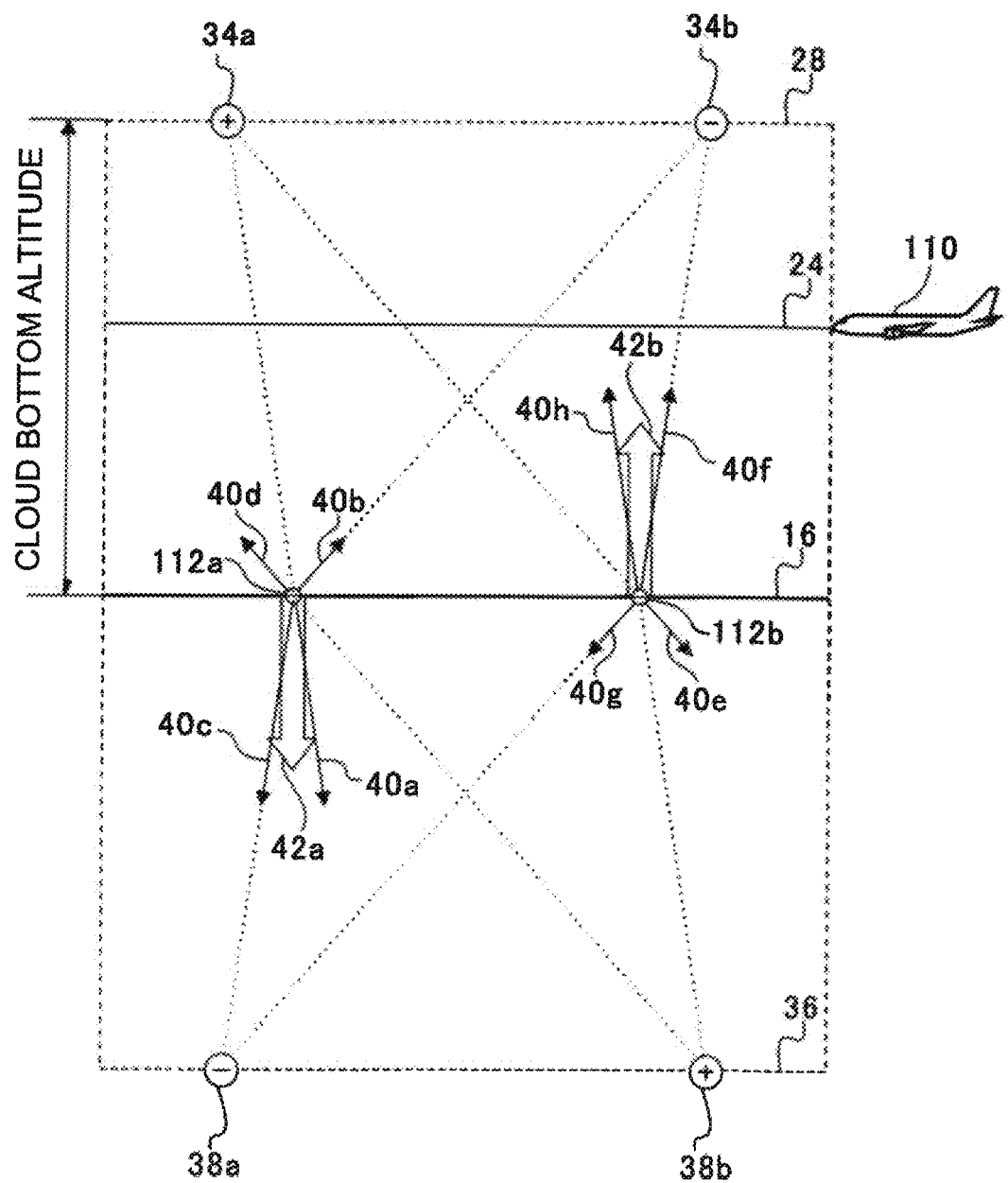
FIG. 6 explains the processing in the matrix deriving part.

FIG. 5 to FIG. 7 explain the processing in the matrix deriving part 122. First, the matrix deriving part 122 sets a target area 24, in which the aircraft 110 may fly, near the flight path 14. For example, the matrix deriving part 122 sets, as the target area 24, a predetermined range on a horizontal plane derived by extending the flight path 14 of the aircraft 110 horizontally as shown in FIG. 5.

Next, the matrix deriving part 122 defines a virtual cloud bottom surface 28 extending in a horizontal direction at an altitude where the cloud bottom 10 has a large occupied area in a target space 26 derived by projecting the target area 24 in the vertical direction, based on the position, height, and size of the cloud bottom 10 in the target space 26.

Then, the matrix deriving part 122 virtually sets electric charges of the cloud bottom 10 on the assumption that the electric charges are distributed only on the cloud bottom surface 28. For example, the matrix deriving part 122 forms a mesh 30, divided longitudinally and laterally at predetermined intervals respectively, on the cloud bottom surface 28 in FIG. 5, and temporarily sets electric charges lying on virtual points 32 which are the intersection points of the mesh 30. At this time, the respective electric charges at the virtual points 32 are unknown.

The matrix deriving part 122 derives a coefficient matrix based on the method of mirror charges (also known as the method of images and the method of image charges), and the charge simulation technique. Concretely, the matrix deriving part 122 defines the ground surface 16 and the cloud bottom surface 28, as shown in the longitudinal sectional view of FIG. 6. The electric charges 34a and 34b are assumed at the virtual points 32 on the cloud bottom surface 28 respectively, and thereby an electric field arises at each of the electric field sensors 112a and 112b on the ground surface 16 due to the electric charges 34a and 34b. Here, two virtual points 32 and two electric field sensors 112 will be mentioned and described for convenience in explanation although there are more than two virtual points 32 and more than two electric field sensors 112.

Here, the ground surface 16 is considered as a conductor, and the method of mirror charges by which the electric charge density arising on the surface of a conductor is obtained by defining virtual electric charges is adopted. For example, the matrix deriving part 122 sets the ground surface 16 as the axis of symmetry, defines a mirrored surface 36 line-symmetric to the cloud bottom surface 28, and defines virtual electric charges 38a and 38b lying on positions line-symmetric to the positions of the electric charges 34a and 34b respectively. Note that, one electric charge 34a and one virtual electric charge 38a have the relation that the sign of positive and negative is inverted to each other while the other electric charge 34b and the other virtual electric charge 38b have the relation that the sign of positive and negative is inverted to each other.

In this case, Coulomb's force 40 shown by the solid arrows (shown as 40a to 40h in FIG. 6) acts at the positions of the electric field sensors 112a and 112b on the ground surface 16 due to the electric charges 34a and 34b, and the virtual electric charges 38a and 38b. Concretely, Coulomb's force 40a due to the electric charge 34a, Coulomb's force 40b due to the electric charge 34b, Coulomb's force 40c due to the virtual electric charge 38a, and Coulomb's force 40d due to the virtual electric charge 38b act at the position of the electric field sensor 112a. Meanwhile, Coulomb's force 40e due to the electric charge 34a, Coulomb's force 40f due to the electric charge 34b, Coulomb's force 40g due to the virtual electric charge 38a, and Coulomb's force 40h due to the virtual electric charge 38b act at the position of the electric field sensor 112b.

The two kinds of the resultant force of the Coulomb's force 40 acting on the electric field sensors 112 become electric field intensities 42a and 42b shown by the white arrows respectively. When each of the electric field intensities 42a and 42b is expressed by an integrated value of electric field intensities corresponding to respective electric charges, based on the charge simulation technique, the electric field intensities 42a and 42b are each expressed by a linear algebraic equation as shown in FIG. 7.

In the linear algebraic equation of FIG. 7, the cloud bottom altitude is the distance between the cloud bottom surface 28 and the ground surface 16 while the point-to-point distance is the distance between the virtual point 32 and the electric field sensor 112, as shown in FIG. 6. The CLOUD BOTTOM ALTITUDE/POINT-TO-POINT DISTANCE shows component of the Coulomb's force 40 in an electric field direction. The reason why the CLOUD BOTTOM ALTITUDE/POINT-TO-POINT DISTANCE is doubled is because the Coulomb's force 40 arises at the two positions of the electric charge 34 and the virtual electric charge 38 per one electric charge 34.

Since the electric charge 34 is line-symmetric to the virtual electric charge 38 with respect to the axis of symmetry consisting of the ground surface 16, the direction of the electric field certainly becomes perpendicular to the ground surface 16 as shown in FIG. 6. The matrix deriving part 122 derives the coefficient matrix, to be multiplied by the respective electric charges 34 on the cloud bottom surface 28, based on the linear algebraic equation of FIG. 7.

When the electric field distribution 18 on the ground surface 16 and the coefficient matrix have been specified as described above, the electric charges 34 at the virtual points 32 should be derived by multiplying the electric field distribution 18 on the ground surface 16 by the inverse matrix of the coefficient matrix. Nevertheless, the electric charge distribution 20 forming the same electric field distribution 18 on the ground surface 16 can take a plurality of distributions, and therefore cannot be derived simply. Accordingly, what is called a pseudo inverse matrix that the concept of an inverse matrix in linear algebras is generalized is used in the present implementation (Pseudo Inverse Matrix Deriving Processing S104)

The pseudo inverse matrix deriving part 124 derives a pseudo inverse matrix based on the coefficient matrix using a technological calculation language, e.g., MATLAB (registered trademark).

(Electric Charge Distribution Deriving Processing S106)

The electric charge distribution deriving part 126 derives the electric charge distribution 20 on the cloud bottom surface 28 by multiplying the electric field distribution 18 on the ground surface 16 by the pseudo inverse matrix obtained by the pseudo inverse matrix deriving part 124.

Here, not a proper inverse matrix but the pseudo inverse matrix has been used, and therefore the electric charge distribution 20 may be distorted from original values. Accordingly, the electric charge distribution deriving part 126 smoothes the electric charge distribution 20 using a smoothing filter, e.g., a convolution filter.

For example, the electric charge distribution deriving part 126 makes an average value of electric charges 34 in a virtual point group, centering on a desired virtual point 32 and consisting of longitudinal three points and lateral three points, to the electric charge 34 at the desired virtual point 32 using a convolution filter. The electric charge distribution deriving part 126 sequentially changes (sweeps) the desired virtual point 32, and perform such smoothing processing for every desired virtual point 32. Although a convolution filter has been exemplified here, not only a convolution filter but various smoothing filters may be used (Electric Field Distribution Deriving Processing S108)

The electric field distribution deriving part 128 derives the electric field distribution on the ground surface 16 by electrostatic analysis of the electric charge distribution 20 smoothed by the electric charge distribution deriving part 126. As for the electrostatic analysis, existing desired technique can be used, and therefore detailed explanation thereof is omitted here.

In addition, the electric field distribution deriving part 128 calibrates absolute quantities changed due to the smoothing of the electric charge distribution 20 by the electric charge distribution deriving part 126. Concretely, the electric field distribution deriving part 128 derives a proportional constant which is a ratio between the derived electric field distribution on the ground surface 16 and the electric field distribution 18 on the ground surface 16 generated by the information acquisition part 120. The proportional constant can be expressed as (a peak value of the electric field distribution 18 on the ground surface 16 generated by the information acquisition part 120)/(a peak value of the derived electric field distribution on the ground surface 16), for example. The proportional constant may be also derived based on not only peak values but average values, median values or the like.

The electric field distribution deriving part 128 corrects the electric charge distribution 20 smoothed by the electric charge distribution deriving part 126 by multiplying the smoothed electric charge distribution 20 by the proportional constant. Then, the electric field distribution deriving part. 128 derives electric field distributions at various positions, based on the electric charge distribution 20 which has been multiplied by the proportional constant. For example, the electric field distribution deriving part 128 derives an electric field distribution on the flight path 14 of the aircraft 110, based on the electric charge distribution 20 which has been multiplied by the proportional constant.

(Information Transmission Processing S110)

The information transmission part 130 transmits, to the aircraft 110, the electric field distribution 22 in an area corresponding to the flight path 14 of the aircraft 110, out of the electric field distributions derived by the electric field distribution deriving part 128.

FIG. 8 and FIGS. 9A to 9D explain an example of calculation in the electric field deriving processing. Here, MATLAB is used as a technical calculation language. First, an electric field distribution (E1) on the ground surface 16 is virtually set by program codes (A) to (D) of FIG. 8. Concretely, the height, range, mesh number and the like of the cloud bottom surface 28 are initially set by the program code (A) of FIG. 8. Then, an electric charge distribution (C0) that electric charges are disposed at two positions is temporally set on the cloud bottom surface 28 by the program code (B) of FIG. 8. Subsequently, a coefficient matrix (k) in the linear algebraic equation between the electric field distribution (E1) on the ground surface 16 and the electric charge distribution (C0) is derived by the program code (C) of FIG. 8. After that, an electric field distribution (E0) which is a product of the coefficient matrix (k) and the electric charge distribution (C0) is made to the electric field distribution (E1) on the ground surface 16 by the program code (D) of FIG. 8. In this way, the electric field distribution (E1) on the ground surface 16 is virtually set.

Figure 9A:
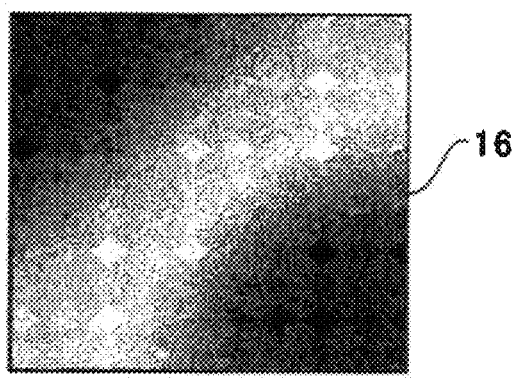
FIGS. 9A to 9D explain an example of calculation in the electric field deriving processing.

When the electric field distribution (E1) on the ground surface 16 set in this way is mapped on the ground surface 16, electric field intensity as shown in FIG. 9A is derived. In the figure, the electric field intensity becomes large as the position is shifted from the upper left to the lower right. Here, it is assumed that the information acquisition part 120 generated the electric field distribution (E1) on the ground surface 16 while the matrix deriving part 122 derived the coefficient matrix (k).

Figure 9B:
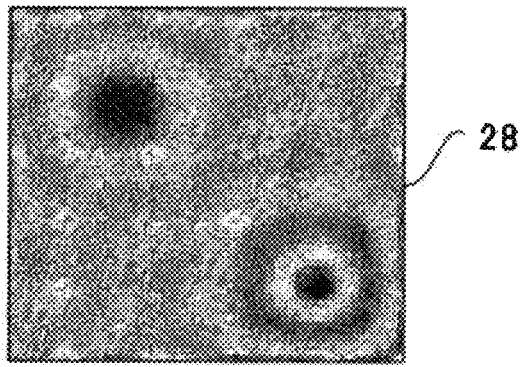

The pseudo inverse matrix deriving part 124 derives a pseudo inverse matrix (pinv(k)) of the coefficient matrix (k) by the function pinv of MATLAB. the electric charge distribution deriving part 126 derives an electric charge distribution (C1) on the cloud bottom surface 28 by multiplying the electric field distribution (E1) on the ground surface 16 by the pseudo inverse matrix (pinv(k)) of the coefficient matrix (k), by the program code (E) of FIG. 8. When the electric charge distribution (C1) on the cloud bottom surface 28 is mapped, Coulomb's force is shown as FIG. 9B. In FIG. 9B, a negative electric charge has arisen at the upper left while a positive electric charge has arisen at the lower right.

Figure 9C:
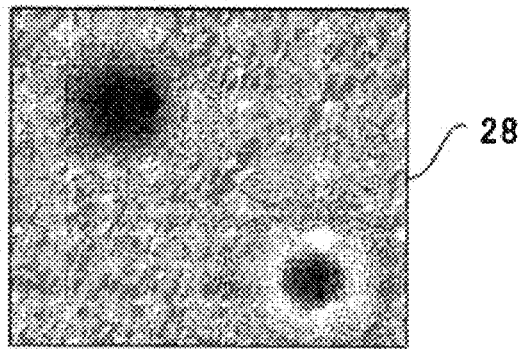
Figure 9D:
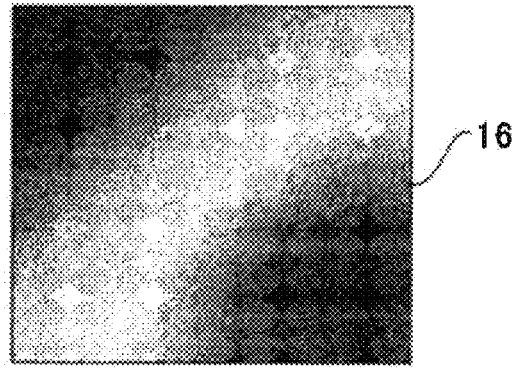

With reference to FIG. 9B, it can be understood that the electric charge distribution (C1) on the cloud bottom surface 28 is partially distorted. Accordingly, the electric charge distribution deriving part 126 obtains a smoothed electric charge distribution (C2) by convolution filter processing (filter 2) of the electric charge distribution (C1) on the cloud bottom surface 28, by the program code (F) of FIG. 8. In this way, the electric charge distribution (C2) on which the electric charge changes smoothly can be obtained as shown in FIG. 9C.

The electric field distribution deriving part 128 derives an electric field distribution (E2) on the ground surface 16 based on the smoothed electric charge distribution (C2), by the program code (G) of FIG. 8. In this way, the electric field distribution (E2) on the ground surface 16 is obtained as shown in FIG. 91). The electric field distribution deriving part 128 derives a proportional constant which is a ratio between the electric field distribution (E1) acquired by the information acquisition part 120 and the derived electric field distribution (E2), by the program code (H) of FIG. 8. The electric field distribution deriving part 128 multiplies the smoothed electric charge distribution (C2) by the proportional constant, and then derives an electric field distribution on the flight path 14 based on the electric charge distribution (C2) which has been multiplied by the proportional constant.

(Aircraft 110)

Figure 10A:
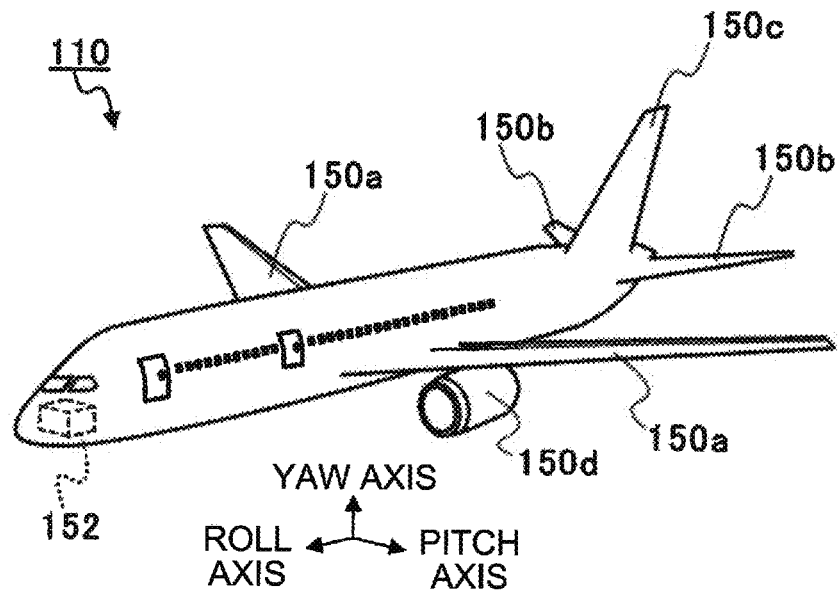
FIG. 10A and FIG. 10B show a schematic configuration of the aircraft.
Figure 10B:
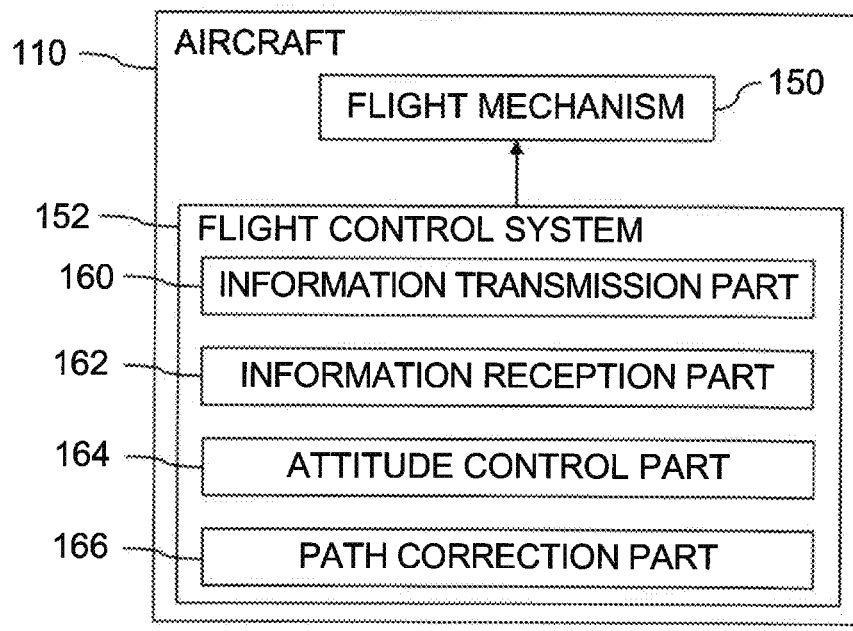

FIG. 10A and FIG. 10B show a schematic configuration of the aircraft 110. The aircraft 110 includes a flight mechanism 150 and a flight control system 152. The flight mechanism 150 has fixed wings including main wings 150a, horizontal tail planes 150b and a vertical tail 150c, and an internal combustion engine 150d (e.g., a jet engine or a reciprocating engine) for obtaining thrust force. The flight mechanism 150 generates lift around the wings by the thrust force so that an airframe can keep floating in atmospheric air.

The flight control system 152 is composed of a computer including a CPU, a ROM storing programs and the like, a RAM as a work area, and the like. The flight control system 152 receives manipulated input by a pilot maneuvering the aircraft 110, and controls the flight mechanism 150 to keep the aircraft 110 flying. The flight control system 152 also functions as an information transmission part 160, an information reception part 162, an attitude control part 164 and a path correction part 166, by collaborating with programs. Here, configuration related to the lightning strike avoidance which is an object of the present implementation will be described while description about configuration unrelated to the present implementation is omitted.

The information transmission part 160 transmits, to the ground system 114, the position of the aircraft 110 and the flight path 14 along which the aircraft 110 is planned to fly in predetermined time. The information reception part 162 receives the electric field distribution 22 on the flight path 14 of the aircraft 110. In this way, the intensity and direction of the electric field on the flight path 14 can be grasped. The attitude control part 164 controls the attitude of the aircraft 110 based on the direction of the electric field so that the attitude of the aircraft 110 may become one in which the probability of damage by lightning lowers. The path correction part 166 corrects the flight path 14 so that the attitude of the aircraft 110 derived by the attitude control part 164 can be kept.

Figure 11A:
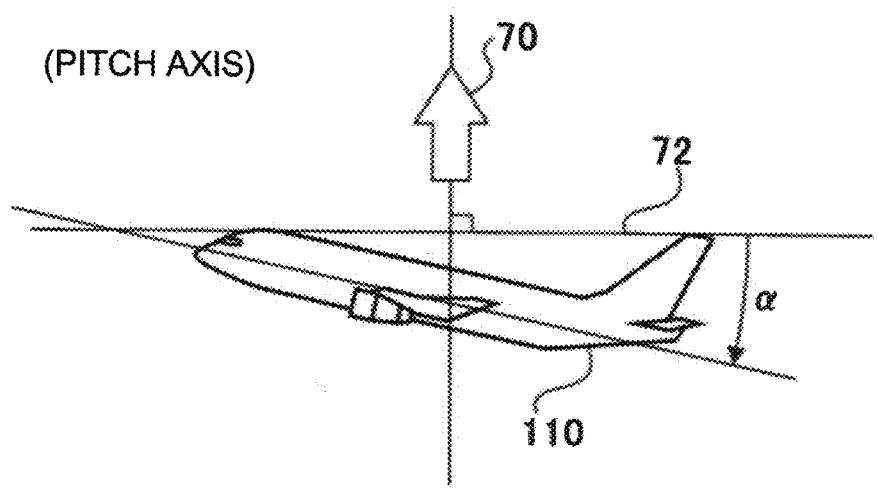
FIG. 11A and FIG. 11B explain the processing by the attitude control part.
Figure 11B:
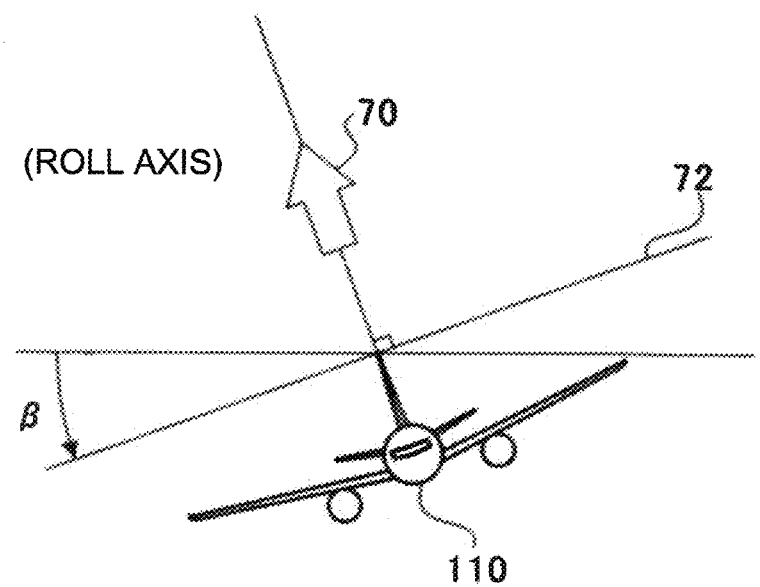

FIG. 11A and FIG. 11B explain the processing by the attitude control part 164. When the electric field has arisen in an electric field direction 70 as shown in FIG. 11A, for example, the attitude control part 164 tilts the angle around the pitch axis (pitch angle) by α degrees so that a protruded plane 72 formed by parts of the aircraft 110 protruded vertically upward may perpendicularly intersect with the electric field direction 70. Meanwhile, when the electric field has arisen in an electric field direction 70 as shown in FIG. 11B, the attitude control part 164 tilts the angle around the roll axis (roll angle) by β degrees so that the protruded plane 72 may perpendicularly intersect with the electric field direction 70. In this way, the electric field intensity at each protruded part of the aircraft 110 can be equalized, and thereby the possibility of lightning strike due to the aircraft 110 as a trigger can be reduced.

In the present implementation, the electric field not only in the vicinity of the aircraft 110 but on the whole flight path 14 along which the aircraft 110 is planned to fly is estimated, and therefore the flight path 14 on which thunder can be avoided can be derived more accurately to reduce the probability of damage by lightning. In addition, the aircraft 110 can also change the attitude according to the direction of the estimated electric field on the whole flight path 14 to reduce the probability of damage by lightning more.

Although a preferred implementation of the present invention has been described above with reference to the accompanying drawings, the present invention is not obviously limited to the implementation. It is clear that a person skilled in the art can arrive at various kinds of examples of changes and/or examples of modifications within the description in claims, and they also belong to the technical scope of the present invention deservedly.

A program for making a computer function as respective functional parts and a storage media, such as a flexible disk, a magneto-optical disc, a ROM, a compact disc (CD), a digital versatile disc (DVD), or a blu-ray disc (BD), which can be read by a computer, storing the program are also provided. Here, a program is a means for data processing described by a desired language and description method.

Although an example of mounting the respective functional parts in the ground system 114 and the aircraft 110 respectively has been described in the above-mentioned implementation, a part or all of the functional parts of the ground system 114 may work in the aircraft 110 while a part or all of the functional parts of the aircraft 110 may work in the ground system 114.

It is not necessary to process the respective processes, in the electric field deriving processing in the present specification, in time series in the order shown as the flow chart necessarily. The respective processes may be processed in parallel and include processing by a subroutine or subroutines.

What is claimed is:

1. An aviation system comprising:
   electric field sensors; and
   a ground system including a computer configured to communicate with each of the electric field sensors,
   wherein the computer is configured to:
      acquire electric field intensities from the electric field sensors respectively, and generate a first electric field distribution on a ground surface based on the electric field intensities;
      derive a matrix, the first electric field distribution on the ground surface being derived by multiplying the matrix by electric charges temporarily set on a horizontal plane at a predetermined altitude;
      derive a pseudo inverse matrix of the matrix;
      derive an electric charge distribution on the horizontal plane by multiplying the pseudo inverse matrix by the first electric field distribution on the ground surface; and
      derive a second electric field distribution on a flight path of an aircraft based on the electric charge distribution,
   further comprising a flight control system including another computer configured to change an attitude of the aircraft according to a direction of the second electric field distribution on the flight path of the aircraft to reduce influence of a lightning strike on the aircraft.

2. The aviation system according to claim 1,
   wherein the computer is further configured to:
      smooth the derived electric charge distribution;
      derive a third electric field distribution on the ground surface based on the smoothed electric charge distribution;
      derive a proportional constant which is a ratio between the first electric field distribution on the ground surface and the third electric field distribution on the ground surface;
      multiply the smoothed electric charge distribution by the proportional constant; and
      derive the second electric field distribution on the flight path based on the electric charge distribution which has been multiplied by the proportional constant.

3. An aviation method comprising:
   acquiring electric field intensities from electric field sensors respectively by a computer included in a ground system communicating with each of the electric field sensors, and generate a first electric field distribution on a ground surface based on the electric field intensities;
   deriving a matrix, the first electric field distribution on the ground surface being derived by multiplying the matrix by electric charges temporarily set on a horizontal plane at a predetermined altitude;
   deriving a pseudo inverse matrix of the matrix;
   deriving an electric charge distribution on the horizontal plane by multiplying the pseudo inverse matrix by the first electric field distribution on the ground surface;
   deriving a second electric field distribution on a flight path of an aircraft based on the electric charge distribution; and changing an attitude of the aircraft according to a direction of the second electric field distribution on the flight path of the aircraft to reduce influence of a lightning strike on the aircraft.

4. The aviation method according to claim 3, wherein:
the derived electric charge distribution is smoothed;
a third electric field distribution on the ground surface is derived based on the smoothed electric charge distribution;
a proportional constant which is a ratio between the first electric field distribution on the ground surface and the third electric field distribution on the ground surface is derived;
the smoothed electric charge distribution is multiplied by the proportional constant; and
the second electric field distribution on the flight path is derived based on the electric charge distribution which has been multiplied by the proportional constant.

5. The aviation system according to claim 1, wherein, during the deriving of the matrix, a target area is set as a predetermined range on the horizontal plane by extending the flight path horizontally.

6. The aviation system according to claim 1, wherein the second electric field distribution is derived on an entirety of the flight path of the aircraft based on the electric charge distribution.

7. The aviation system according to claim 2,
wherein the smoothing of the derived electric charge distribution includes:
making an average value of electric charges in a virtual point group, centering on a desired virtual point and consisting of longitudinal three points and lateral three points, to the electric charge at the desired virtual point using a convolution filter; and
sequentially changes the desired virtual point, and perform such smoothing processing for every desired virtual point.

8. The aviation system according to claim 2,
wherein the computer is further configured to:
calibrate absolute quantities changed due to the smoothing of the derived electric charge distribution.

* * * * *